United States Patent
Anuchin et al.

(10) Patent No.: US 10,663,510 B2
(45) Date of Patent: May 26, 2020

(54) INSULATION DETECTING METHOD FOR ELECTRIC MACHINE

(71) Applicant: HIWIN MIKROSYSTEM CORP., Taichung (TW)

(72) Inventors: Alecksey Anuchin, Taichung (TW); Dmitry Shpak, Taichung (TW); Alexandr Zharkov, Taichung (TW)

(73) Assignee: HIWIN MIKROSYSTEM CORP., Taichung (TW)

( * ) Notice: Subject to any disclaimer, the term of this patent is extended or adjusted under 35 U.S.C. 154(b) by 29 days.

(21) Appl. No.: 16/012,209

(22) Filed: Jun. 19, 2018

(65) Prior Publication Data

US 2019/0383870 A1    Dec. 19, 2019

(51) Int. Cl.
| | | |
|---|---|---|
| *G01R 31/02* | (2006.01) | |
| *G01R 23/06* | (2006.01) | |
| *G01R 31/34* | (2020.01) | |
| *H02P 27/06* | (2006.01) | |

(52) U.S. Cl.
CPC ........... *G01R 31/025* (2013.01); *G01R 23/06* (2013.01); *G01R 31/343* (2013.01); *H02P 27/06* (2013.01)

(58) Field of Classification Search
CPC .... G01R 31/025; G01R 23/06; G01R 31/343; H02P 27/06; H03K 17/0822; H03K 3/01; H01L 27/0251; G01N 35/0092; G01N 21/76

USPC ....... 324/500, 509, 522, 713, 600, 160, 177, 324/76.11, 76.39, 76.69, 76.77, 120, 124
See application file for complete search history.

(56) References Cited

U.S. PATENT DOCUMENTS

| | | | |
|---|---|---|---|
| 8,164,298 B2 | 4/2012 | Anwar | |
| 8,896,315 B1 * | 11/2014 | Davies | H02J 7/0016 324/434 |
| 2002/0121902 A1 | 9/2002 | Suzuki | |
| 2009/0195205 A1 | 8/2009 | Ide | |
| 2013/0245869 A1 * | 9/2013 | Nishida | B60L 3/0069 701/22 |
| 2015/0194922 A1 | 7/2015 | Sato | |
| 2015/0256116 A1 | 9/2015 | Tateda | |

* cited by examiner

*Primary Examiner* — Melissa J Koval
*Assistant Examiner* — Trung Nguyen
(74) *Attorney, Agent, or Firm* — Muncy, Geissler, Olds & Lowe, P.C.

(57) ABSTRACT

An insulation detecting method for the electric machine is provided. The leakage current leakage and the leakage resistance are detected and determined by the output potential waveform resulted from the inversion operation of the first switch and the second switch of the driver. Besides, the signal is amplified through the software or the amplification circuit coupled between the electric machine and the driver to detect the leakage resistance approximately to 5MΩ.

8 Claims, 7 Drawing Sheets

INSULATION DETECTING METHOD FOR ELECTRIC MACHINE

BACKGROUND OF THE INVENTION

Field of the Invention

The invention relates to an electric machine, and more particularly to an insulation detecting method for the electric machine.

Description of the Related Art

Approximately 35% of the motor faults occur in the stator of the machine. And about 70% of them are caused by the problems with insulation. This percentage started to increase with widespread of the frequency converters due to high dv/dt at the output of the IGBT-inverter, which results in extra stress to the insulation of the motor. Thus, the implementation of the insulation monitoring system is desirable in order to prevent sudden breakdown of the motor insulation.

Currently there are several solutions for insulation monitoring of the drives. If the drive operates in IT network the insulation monitoring system controls that the electric potentials of the DC link buses are floating and are not clamped to the ground. It is reliable method but its application is limited by IT networks. For TN networks other methods should be used. The most common is to use residual current circuit breaker (RCCB), which is widely used in equipment to prevent fire in case of leakage to the ground due to lack of insulation.

In addition, the US patents, like US 20150256116, US 20150194922, US 20090195205, U.S. Pat. No. 8,164,298 and US 20020121902, also reveal the relative technology. The patents US 20150256116 and US 20150194922 from FANUC both measure the voltage and the current through the resistance divider wherein the US 20150256116 disclosed a microprocessor applied to the parallel drivers' structure to read and calculate the data, and the US 20150194922 disclosed a voltage measure circuit and a current measure circuit to calculate the insulation resistance. The patent US 20090195205 from SANYO measures the current through resistance divider and determines whether the insulation resistance is too low or not according to the comparison between the measured voltage and the reference voltage. The U.S. Pat. No. 8,164,298 from GM measures the voltage from the AC input to the ground and determines whether the insulation resistance is too low or not according to the insulation loss calculated by the processor. The patent US 20020121902 disclosed a detective circuit applied to the electric vehicle and providing a circuit to detect the voltage of a ground detection point between a resistor and a coupling capacitor to determine whether the insulation resistance is too low or not.

SUMMARY OF THE INVENTION

In view of the disadvantages of prior art, the object of the present invention is to provide an insulation detecting method for the electric machine.

To achieve the above object, the leakage current $I_{leakage}$ and the leakage resistance are detected and determined by the output potential waveform resulted from the inversion operation of the first switch and the second switch of the driver. Besides, the signal is amplified through the software or the amplification circuit coupled between the electric machine and the driver to detect the leakage resistance approximately to 5MΩ.

Specifically, the insulation detecting method for the electric machine comprises:

during the stop state, the driver comprises a first switch and a second switch coupled with the dc circuit and operating in an inversion mode to provide an output voltage wherein the first switch is ON when the second switch is OFF, and the first switch is OFF when the second switch is ON; the first switch, the second switch and the dc circuit correspond to the same phase of the electric machine; and sampling the dc circuit through the current sensing unit during the first switch and the second switch operate in the inversion mode to determine the potential change or not wherein the electric machine is not insulated when a leakage current resulted from the potential change is detected, and the electric machine is insulated when the leakage current resulted from the potential change is not detected.

In one embodiment of the present invention, the amplification circuit comprises a first amplification module and a second amplification module wherein the first amplification module comprises a first gain value defined by needs of the control system and maximum current protection, and the second amplification module comprises a second gain value provided to detect the leakage current.

In one embodiment of the present invention, the amplification circuit comprises a filter coupled between the first amplification module and the second amplification module, and the filter is a high-pass filter.

In one embodiment of the present invention, the electric machine is a three-phase inverter motor.

In one embodiment of the present invention, a positive bus bar voltage is provided when the first switch is ON and the second switch is OFF, and a negative bus bar voltage is provided when the first switch is OFF and the second switch is ON such that the potential change results in the output voltage.

In one embodiment of the present invention, the insulation detecting method further comprises averaging the signal of the leakage current during several periods.

DETAILED DESCRIPTION OF THE PREFERRED EMBODIMENTS

Figure 1:
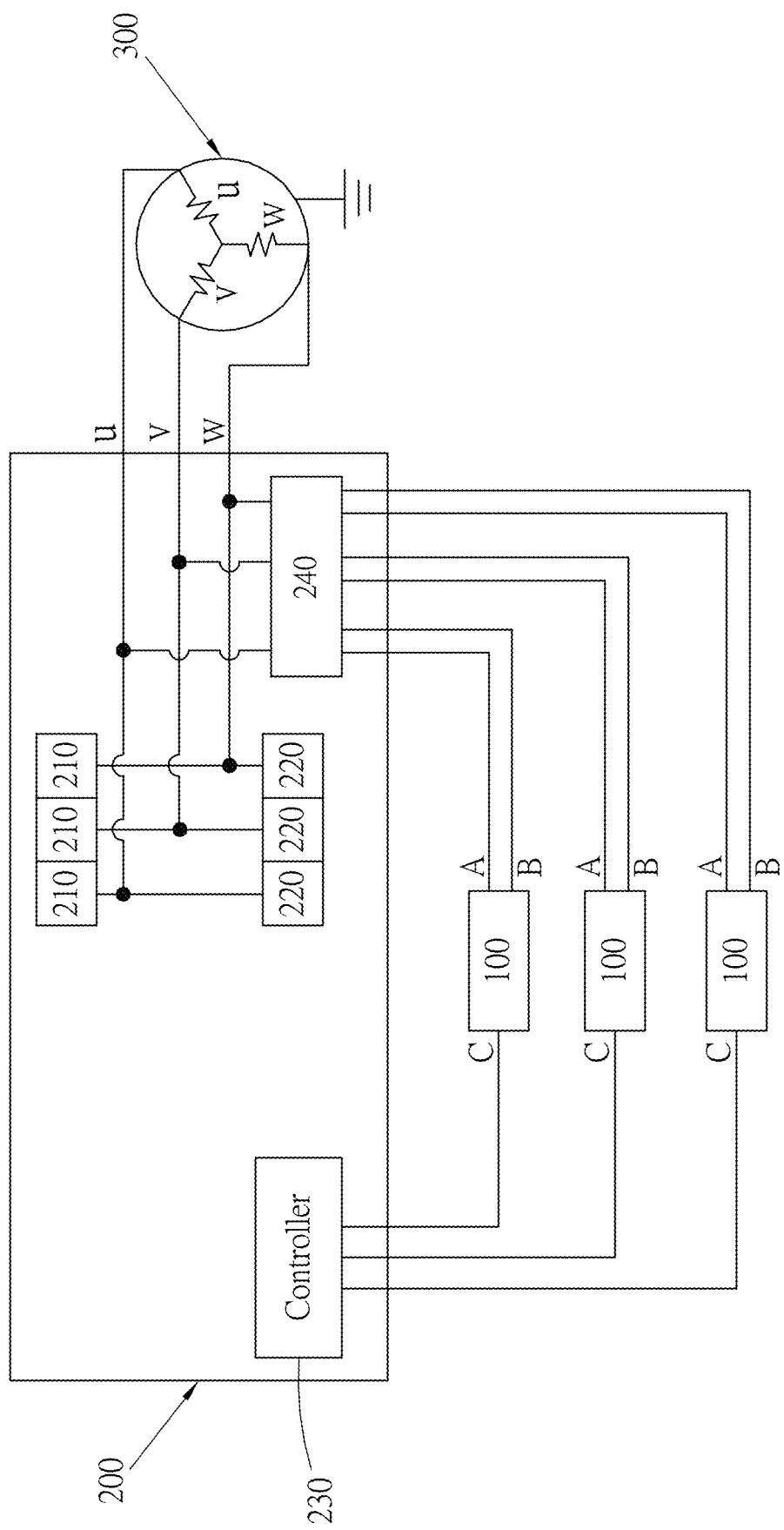
FIG. 1 is a schematic view of the circuit according to the insulation detecting method for electric machine of the present invention.
Figure 2:
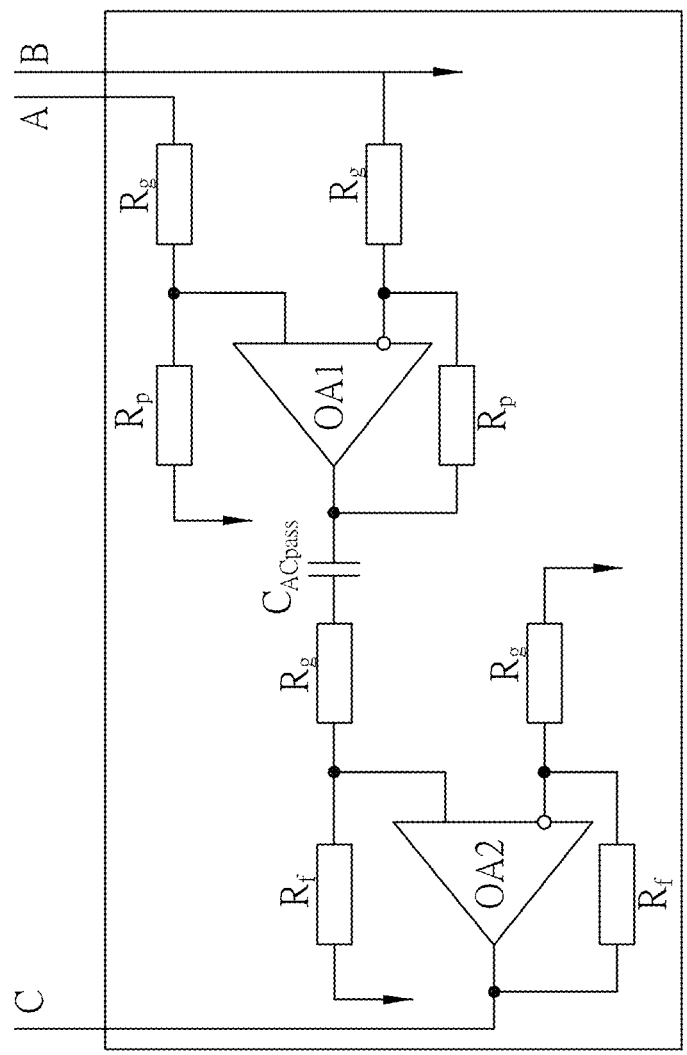
FIG. 2 is a schematic view of the amplification circuit of the present invention.

Refer to FIG. 1 and FIG. 2 illustrating the schematic view of the circuit of the present invention. The controller 230 of the driver 200 is electrically coupled to the amplification circuit 100. The amplification circuit 100 is electrically coupled to the first switch 210, the second switch 220, and the electric machine 300.

Figure 3:
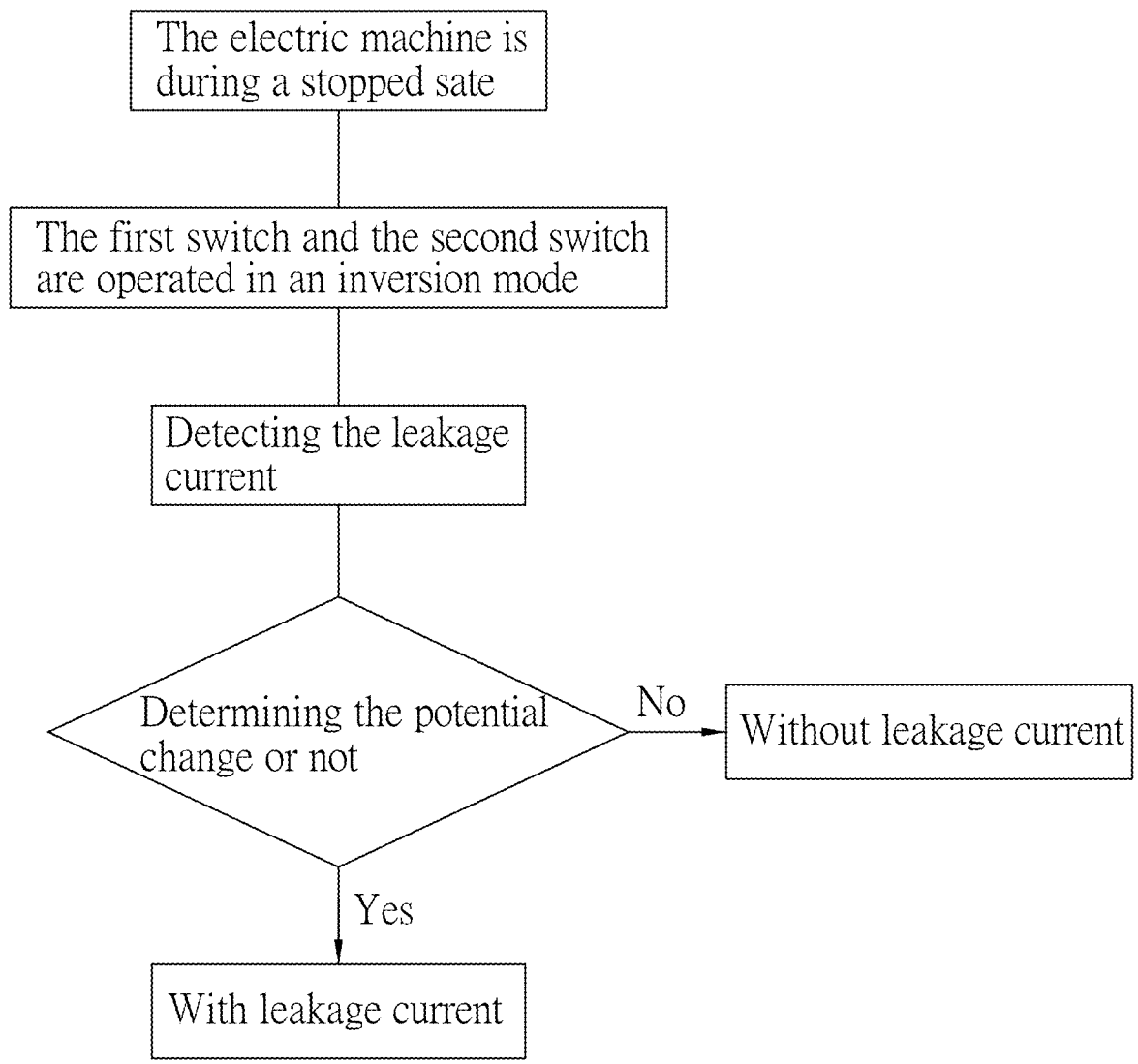
FIG. 3 is a flow chart of the insulation detecting method for electric machine of the present invention.

Refer to FIG. 1, FIG. 2 and FIG. 3. A current sensing unit 240 is provided between the electric machine 300 and the driver 200 to sample the signal of the three phases (U/V/W) respectively, and then the sampled current is amplified by the amplification circuit 100. The amplification circuit 100 is coupled between the electric machine 300 and the driver 200 and comprises a first amplification module OA1, a filter $C_{ACpass}$ and a second amplification module OA2 wherein the filter $C_{ACpass}$ is coupled between the first amplification module OA1 and the second amplification module OA2. The first amplification module OA1 comprises a first gain value defined by needs of the control system and maximum current protection. The filter $C_{ACpass}$ is but not limited to a high-pass filter or a capacitor to filter the dc signal which may be caused by non-idealities of the current sensor, and the filtered signal is amplified by the second amplification module OA2 wherein the second amplification module OA2 comprises a second gain value provided to detect the leakage current $I_{leakage}$. In this embodiment, the second gain value is more than 10V/mA.

Concerning to the insulation detecting method for the electric machine 300, the first switch 210 and the second switch 220 are operated in an inversion mode (the first switch 210 is ON when the second switch 220 is OFF/the first switch 210 is OFF when the second switch 220 is ON) when the electric machine 300 is during a stop sate to provide an output voltage Vout. Moreover, a pair of the first switch 210 and the second switch 220 corresponds to one of the three phases (U/V/W), ex. the first switch 210 and the second switch 220 correspond to the U phase wherein the first switch 210 is ON and the second switch 220 is OFF.

Figure 4:
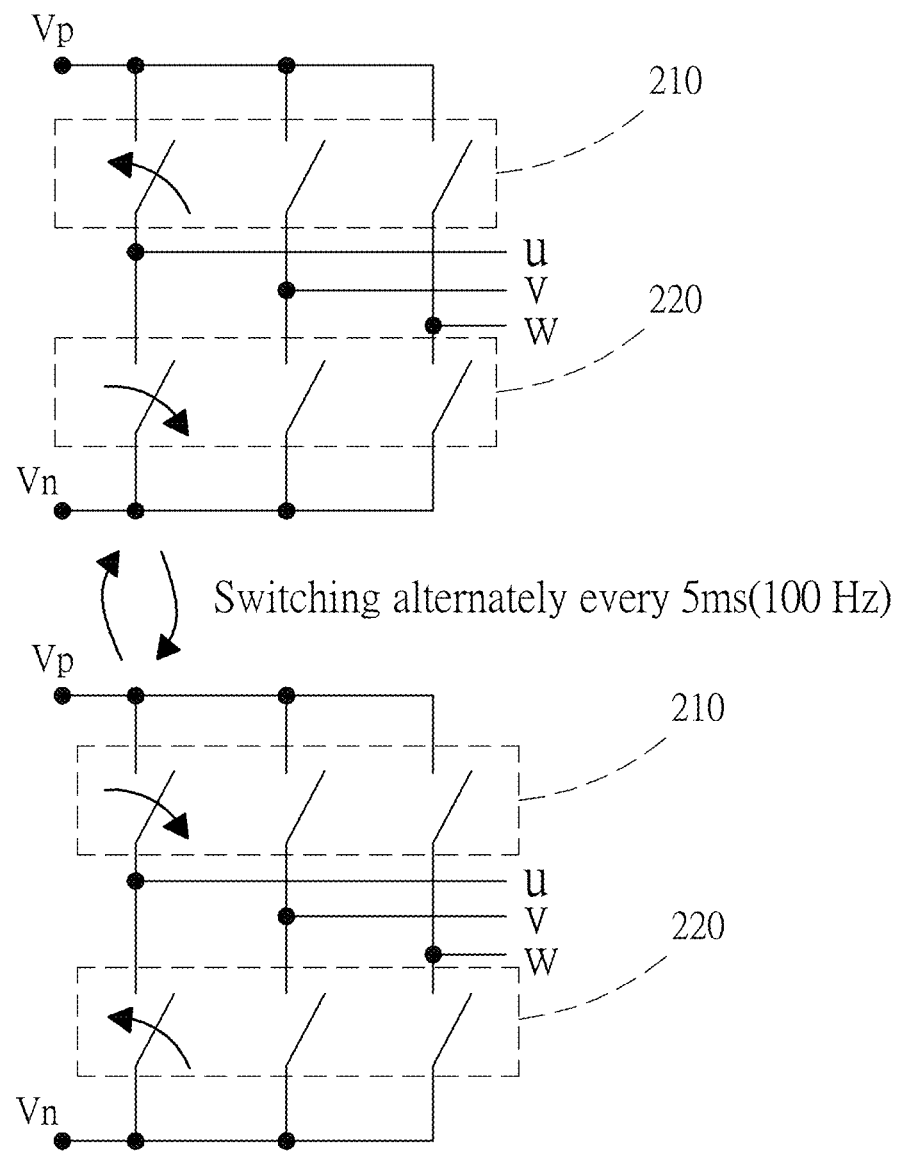
FIG. 4 is a schematic view of the first switch and the second switch operated in the inversion mode of the present invention.
Figure 5:
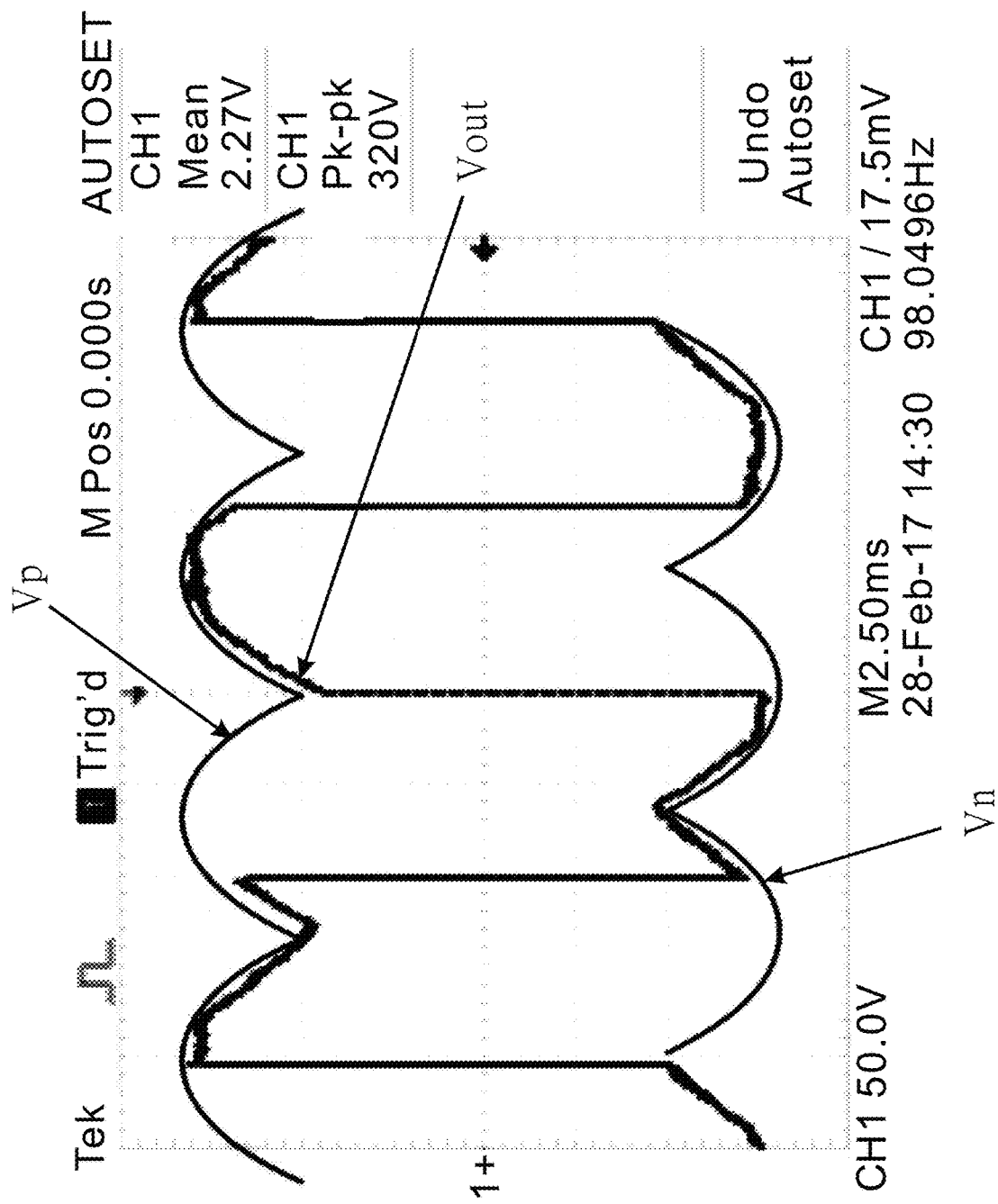
FIG. 5 is a waveform diagram of the positive bus bar voltage and the negative bus bar voltage of the present invention.

Refer to FIG. 4 and FIG. 5. The electric machine 300 provides a positive bus bar voltage Vp when the first switch 210 is ON and the second switch 220 is OFF, and provides a negative bus bar voltage Vn when the first switch 210 is OFF and the second switch 220 is ON to form an output voltage Vout. The first switch 210 and the second switch 220 switch alternately every 5 ms, and the switch frequency is 100 Hz.

Refer to FIG. 6 to FIG. 9 illustrating the leakage current $I_{leakage}$ is detected according to the change of the potential P. Specifically, the current sensing unit 240 samples the signal of the dc circuit to determine the change of the potential P when the first switch 210 and the second switch 220 are operated in the inversion mode. The change of the potential P results in the leakage current $I_{leakage}$, and the signal is amplified and processed by the amplification circuit 100 or software to show the output potential waveform for different leakage resistance. Therefore, the leakage current $I_{leakage}$ is detected to reveal the lack of the insulation of the electrical machine 300.

Figure 6:
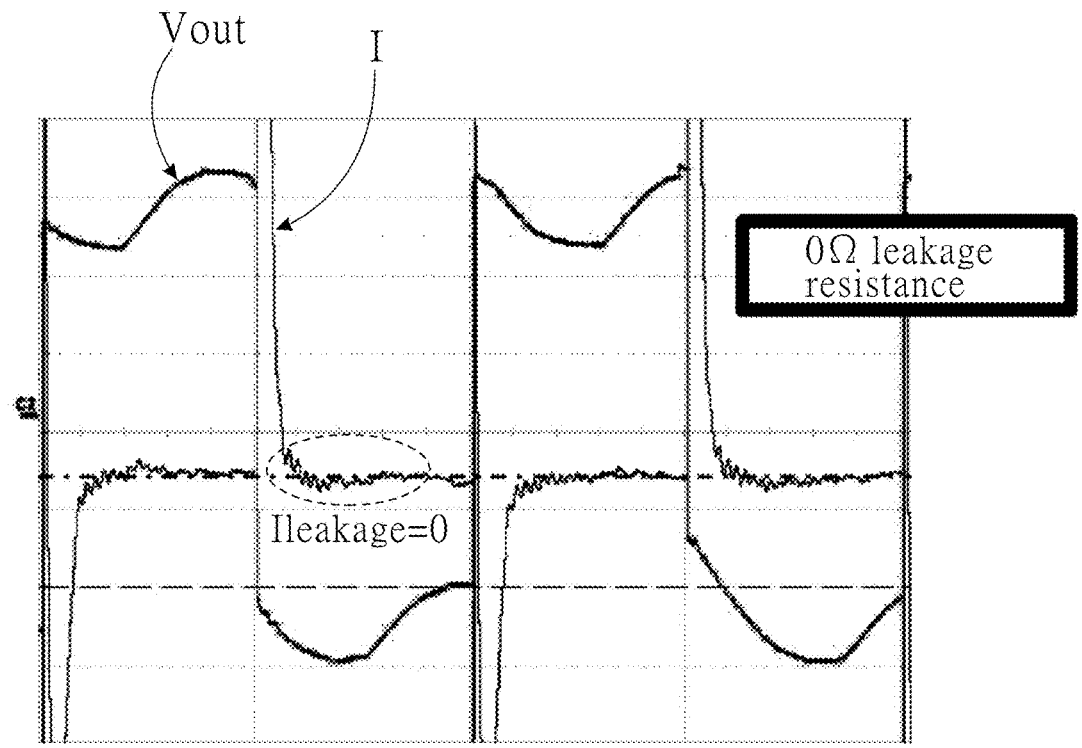
FIG. 6 is a waveform diagram showing the output potential waveform without leakage resistance of the present invention.
Figure 7:
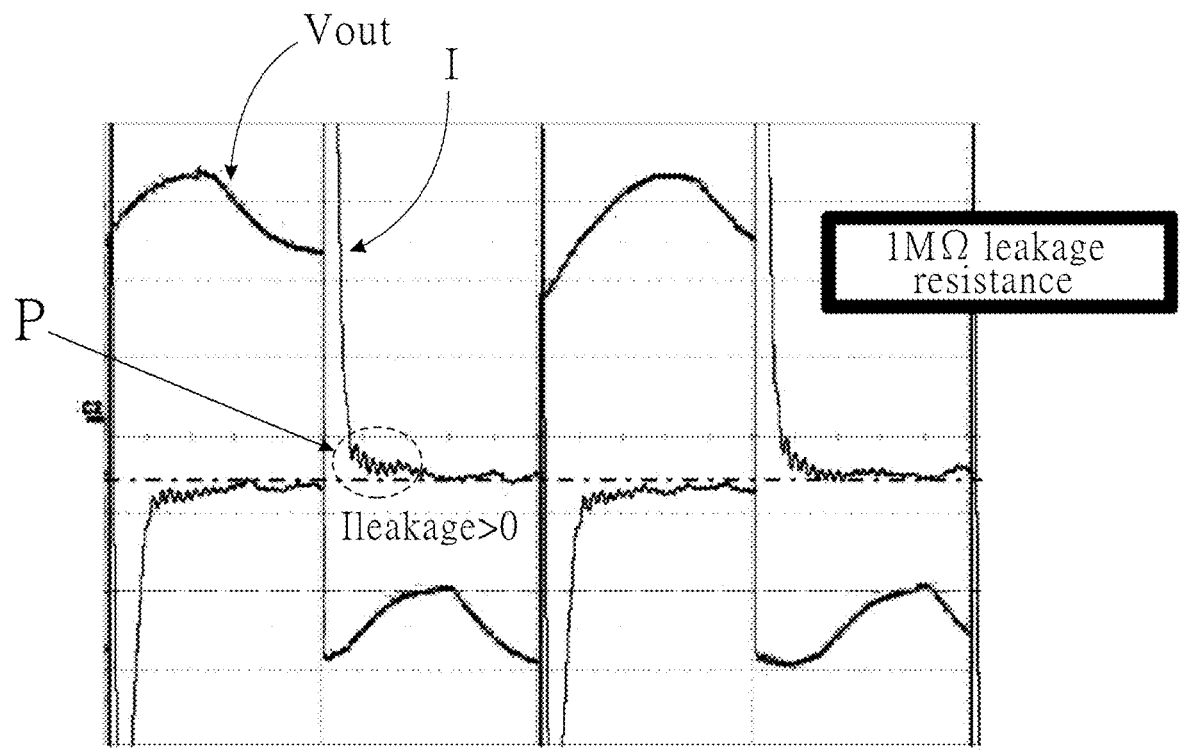
FIG. 7 is a waveform diagram showing the output potential waveform for 1MΩ leakage resistance of the present invention.
Figure 8:
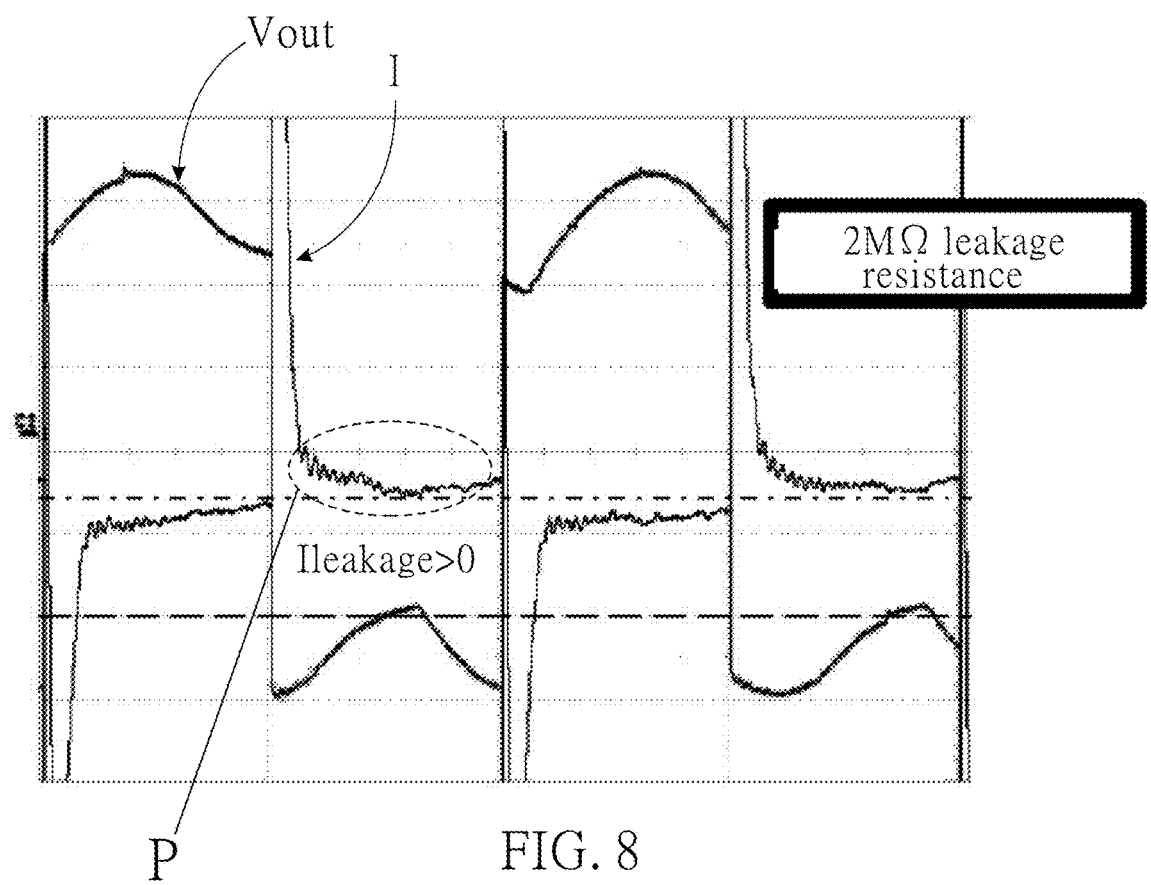
FIG. 8 is a waveform diagram showing the output potential waveform for 2MΩ leakage resistance of the present invention.
Figure 9:
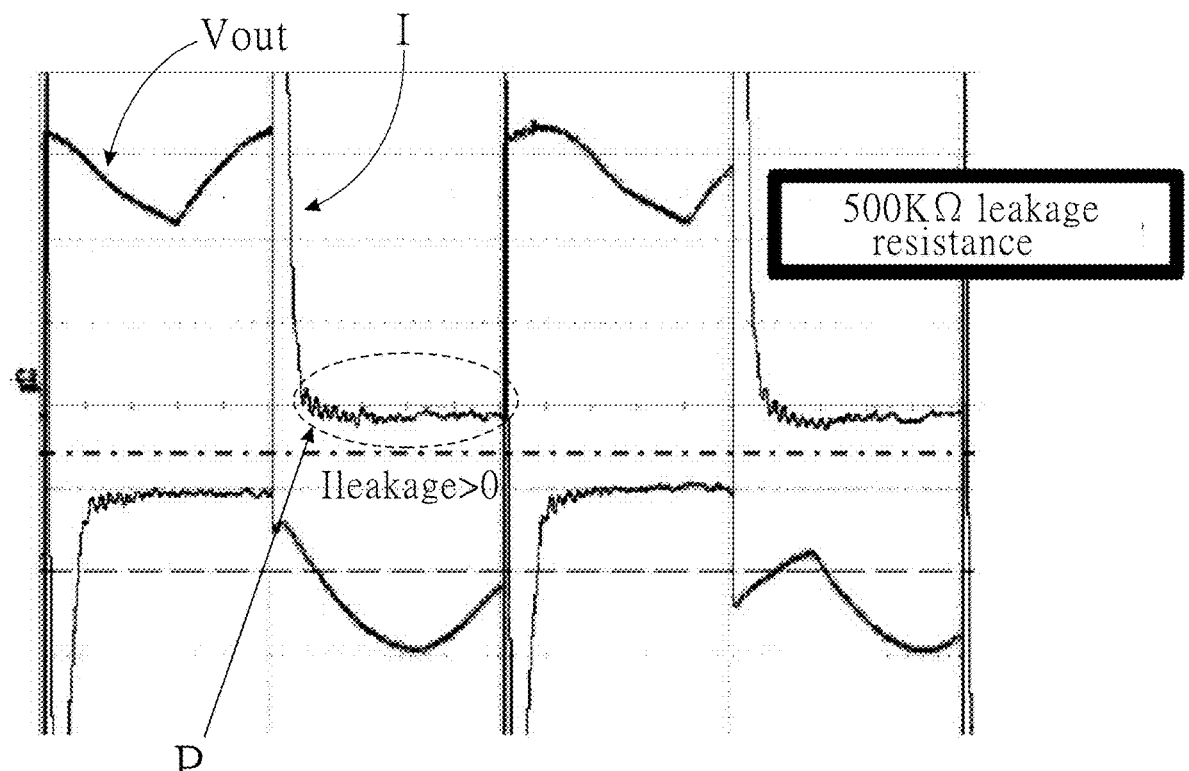
FIG. 9 is a waveform diagram showing the output potential waveform for 500 KO leakage resistance of the present invention.

In addition, the leakage current $I_{leakage}$ and the rated voltage of the driver 200 can be calculated with Ohm's law by a processor (nor shown) to provide a leakage resistance. In FIG. 6, there is neither the leakage current nor the leakage resistance. In FIG. 7, the 1MΩ leakage resistance is calculated by the rated voltage and the leakage current. Similarly, the 2MΩ leakage resistance and the 500KΩ leakage resistance are respectively derived in FIG. 8 and FIG. 9.

Moreover, the first spike of the leakage current flows through parasitic capacitance and should be ignored. The rest of the transient contains information of the leakage resistance. More exact measurement of the leakage current can be done by means of averaging of the signal on several periods.

Therefore, the leakage current $I_{leakage}$ and the leakage resistance are detected and determined by the output potential waveform resulted from the inversion operation of the first switch 210 and the second switch 220 of the driver 200. Besides, the signal is amplified through the software or the amplification circuit 100 coupled between the electric machine 300 and the driver 200 to detect the leakage resistance approximately to 5MΩ.

It is to be understood that the above descriptions are merely the preferable embodiment of the present invention and are not intended to limit the scope of the present invention. Equivalent changes and modifications made in the spirit of the present invention are regarded as falling within the scope of the present invention.

What is claimed is:

1. An insulation detecting method for electric machine applied between an electric machine and a driver controlling the electric machine to sample a signal of a dc circuit through a current sensing unit and amplify the sampled signal through an amplification circuit, comprising:
   during the stop state, the driver comprises a first switch and a second switch coupled with the dc circuit and operating in an inversion mode to provide an output voltage wherein the first switch is ON when the second switch is OFF, and the first switch is OFF when the second switch is ON; the first switch, the second switch and the dc circuit correspond to the same phase of the electric machine; and
   sampling the dc circuit through the current sensing unit during the first switch and the second switch operate in the inversion mode to determine the potential change or not wherein the electric machine is not insulated when a leakage current resulted from the potential change is detected, and the electric machine is insulated when the leakage current resulted from the potential change is not detected;
   wherein the amplification circuit comprises a first amplification module and a second amplification module; the first amplification module comprises a first gain value defined by needs of the control system and maximum current protection, and the second amplification module comprises a second gain value provided to detect the leakage current.

2. The insulation detecting method for electric machine as claimed in claim 1, wherein the amplification circuit comprises a filter coupled between the first amplification module and the second amplification module.

3. The insulation detecting method for electric machine as claimed in claim 2, wherein the filter is a high-pass filter.

4. The insulation detecting method for electric machine as claimed in claim 1, wherein the electric machine is a three-phase inverter motor.

5. An insulation detecting method for electric machine applied between an electric machine and a driver controlling the electric machine to sample a signal of a dc circuit through a current sensing unit and amplify the sampled signal through an amplification circuit, comprising:

during the stop state, the driver comprises a first switch and a second switch coupled with the dc circuit and operating in an inversion mode to provide an output voltage wherein the first switch is ON when the second switch is OFF, and the first switch is OFF when the second switch is ON; the first switch, the second switch and the dc circuit correspond to the same phase of the electric machine; and sampling the dc circuit through the current sensing unit during the first switch and the second switch operate in the inversion mode to determine the potential change or not wherein the electric machine is not insulated when a leakage current resulted from the potential change is detected, and the electric machine is insulated when the leakage current resulted from the potential change is not detected;

wherein a positive bus bar voltage is provided when the first switch is ON and the second switch is OFF, and a negative bus bar voltage is provided when the first switch is OFF and the second switch is ON such that the potential change results in the output voltage.

6. The insulation detecting method for electric machine as claimed in claim 1, further comprising averaging the signal of the leakage current during several periods.

7. The insulation detecting method for electric machine as claimed in claim 5, further comprising averaging the signal of the leakage current during several periods.

8. The insulation detecting method for electric machine as claimed in claim 5, wherein the electric machine is a three-phase inverter motor.

\* \* \* \* \*